United States Patent
Park et al.

(10) Patent No.: US 9,842,980 B2
(45) Date of Patent: Dec. 12, 2017

(54) RESONANCE APPARATUS FOR PROCESSING ELECTRICAL LOSS USING CONDUCTIVE MATERIAL AND METHOD FOR MANUFACTURING THE SAME

(71) Applicant: SAMSUNG ELECTRONICS CO., LTD., Suwon-si (KR)

(72) Inventors: Hosoo Park, Yongin-si (KR); Duck Hwan Kim, Goyang-si (KR); Chul Soo Kim, Hwaseong-si (KR); Sang Uk Son, Yongin-si (KR); In Sang Song, Osan-si (KR); Jeashik Shin, Hwaseong-si (KR); Moonchul Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 326 days.

(21) Appl. No.: 13/934,835

(22) Filed: Jul. 3, 2013

(65) Prior Publication Data

US 2014/0070671 A1     Mar. 13, 2014

(30) Foreign Application Priority Data

Sep. 11, 2012    (KR) .......................... 10-2012-0100437

(51) Int. Cl.
| | | |
|---|---|---|
| H01L 41/09 | (2006.01) | |
| H01L 41/047 | (2006.01) | |
| H01L 41/29 | (2013.01) | |
| H03H 9/02 | (2006.01) | |
| H03H 9/13 | (2006.01) | |
| H03H 9/17 | (2006.01) | |

(52) U.S. Cl.
CPC ............ *H01L 41/047* (2013.01); *H01L 41/29* (2013.01); *H03H 9/0211* (2013.01); *H03H 9/132* (2013.01); *H03H 9/174* (2013.01); *H03H 9/175* (2013.01); *Y10T 29/42* (2015.01)

(58) Field of Classification Search
CPC ..... H04R 17/00; B06B 1/0603; B06B 1/0622; G10K 9/122; G10K 11/28; H01K 41/047; H01K 41/083; H01K 41/0926; H03H 9/131; H03H 9/173; H03H 9/174; H03H 9/02929; H03H 8/08
USPC ................................................. 310/311–371
See application file for complete search history.

(56) References Cited

U.S. PATENT DOCUMENTS 2,635,199 A * 4/1953 Wolfskill ............. H03H 9/0528
                                                       29/25.35
2,994,791 A * 8/1961 Toshio ................. H03H 9/0207
                                                         310/365

(Continued)

FOREIGN PATENT DOCUMENTS

| KR | 10-2005-0072576 A | 7/2005 |
|---|---|---|
| KR | 10-2005-0098714 A | 10/2005 |

(Continued)

*Primary Examiner* — Thomas Dougherty
(74) *Attorney, Agent, or Firm* — NSIP Law

(57) ABSTRACT

A resonance apparatus that processes an electrical loss using a conductive material and a method of manufacturing the resonance apparatus are provided. The resonance apparatus includes a lower electrode formed at a predetermined distance from a substrate, and a piezoelectric layer formed on the lower electrode. The resonance apparatus further includes an upper electrode formed on the piezoelectric layer, and a conductive layer formed on the upper electrode or the lower electrode.

33 Claims, 13 Drawing Sheets

(56) References Cited

U.S. PATENT DOCUMENTS

| | | | | |
|---|---|---|---|---|
| 4,112,323 | A * | 9/1978 | Kawashima | H03H 9/56 310/346 |
| 7,276,994 | B2 * | 10/2007 | Takeuchi | H03H 9/0095 310/346 |
| 8,164,398 | B2 * | 4/2012 | Taniguchi | H03H 3/02 310/312 |
| 2002/0089393 | A1 * | 7/2002 | Tikka | H03H 9/0571 333/133 |
| 2004/0164367 | A1 * | 8/2004 | Park | H03H 9/02094 257/415 |
| 2007/0278899 | A1 * | 12/2007 | Fujii | H03H 9/173 310/324 |
| 2008/0179995 | A1 * | 7/2008 | Umeda | H03H 9/02086 310/324 |
| 2015/0130560 | A1 * | 5/2015 | Yokoyama | H03H 9/173 333/133 |

FOREIGN PATENT DOCUMENTS

| | | |
|---|---|---|
| KR | 10-2008-0055740 A | 6/2008 |
| KR | 10-2012-0017892 A | 2/2012 |

* cited by examiner

RESONANCE APPARATUS FOR PROCESSING ELECTRICAL LOSS USING CONDUCTIVE MATERIAL AND METHOD FOR MANUFACTURING THE SAME

CROSS-REFERENCE TO RELATED APPLICATION(S)

This application claims the benefit under 35 USC §119(a) of Korean Patent Application No. 10-2012-0100437, filed on Sep. 11, 2012, in the Korean Intellectual Property Office, the entire disclosure of which is incorporated herein by reference for all purposes.

BACKGROUND

1. Field

The following description relates to a resonance apparatus that processes an electrical loss using a conductive material and a method of manufacturing the resonance apparatus.

2. Description of Related Art

A film bulk acoustic wave resonator (BAWR) refers to an acoustic device capable of resonating at a predetermined frequency. The film BAWR may use molybdenum (Mo), ruthenium (Ru), and/or tungsten (W), as an electrode.

Performance of a resonator may be reduced, and accordingly, frequency efficiency of a mobile terminal including the resonator may be reduced. For example, if an electrical loss is generated in the resonator, interference between a transmitted signal and a received signal may increase. Accordingly, the mobile terminal may need a larger fractional band gap to process inter symbol interference (ISI), thereby wasting frequency resources.

SUMMARY

In one general aspect, there is provided a resonance apparatus including a lower electrode formed at a predetermined distance from a substrate, and a piezoelectric layer formed on the lower electrode. The resonance apparatus further includes an upper electrode formed on the piezoelectric layer, and a conductive layer formed on the upper electrode or the lower electrode.

In another general aspect, there is provided a film bulk acoustic filter including resonators formed on a substrate, and an electrode connection unit configured to connect an upper electrode to a lower electrode, of at least one of the resonators. The film bulk acoustic filter further includes a grounding unit configured to connect the upper electrode and the lower electrode to ground, and a pad formed on the substrate and configured to connect the upper electrode and the lower electrode to an external terminal. The film bulk acoustic filter further includes a conductive layer forming unit configured to form a conductive layer on the electrode connection unit, or the grounding unit, or the pad, or any combination thereof.

In still another general aspect, there is provided a method of manufacturing a resonance apparatus, including forming a lower electrode at a predetermined distance from a substrate, and forming a piezoelectric layer on the lower electrode. The method further includes forming an upper electrode on the piezoelectric layer, and forming a conductive layer on the upper electrode or the lower electrode.

Other features and aspects will be apparent from the following detailed description, the drawings, and the claims.

Figure 1:
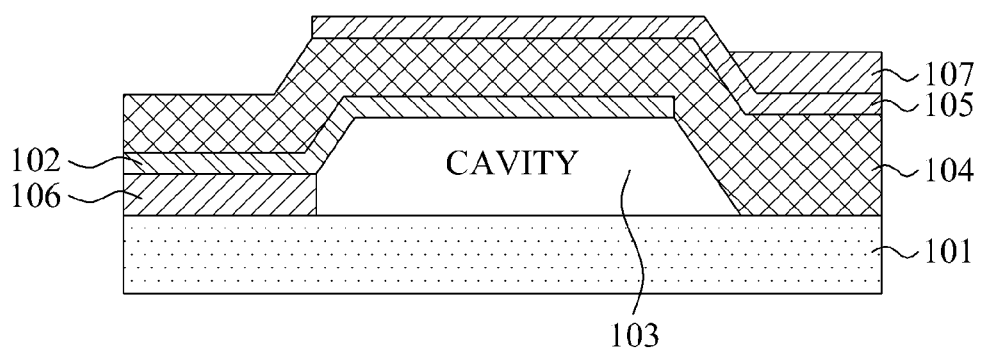
FIG. 1 is a diagram illustrating an example of a resonance apparatus.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses, and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, description of well-known functions and constructions may be omitted for increased clarity and conciseness. Like reference numerals designate like elements throughout the drawings.

It is understood that the features of the disclosure may be embodied in different forms and should not be constructed as limited to the example(s) set forth herein. Rather, example (s) are provided so that this disclosure will be thorough and complete, and will convey the full scope of the disclosure to those skilled in the art. The drawings may not be necessarily to scale, and, in some instances, proportions may have been exaggerated in order to clearly illustrate features of the example(s). When a first layer is referred to as being "on" a second layer or "on" a substrate, it may not only refer to a case where the first layer is formed directly on the second layer or the substrate but may also refer to a case where a third layer exists between the first layer and the second layer or the substrate.

FIG. 1 is a diagram illustrating an example of a resonance apparatus 100. The resonance apparatus 100 includes an air-gap cavity structure including a lower electrode, an upper electrode, and a piezoelectric layer, which are arranged on an upper portion of a substrate, with a predetermined cavity arranged between the substrate and the lower electrode. According to FIG. 1, the resonance apparatus 100 includes a substrate 101, a lower electrode 102, a piezoelectric layer 104, an upper electrode 105, and conductive layers 106 and 107.

The substrate 101 may be doped with silicon (Si). For example, the substrate 101 may include a Si wafer.

The lower electrode 102 is formed over an upper portion of the substrate 101, and is separated by a predetermined distance from the upper portion of the substrate 101. For example, the lower electrode 102 may be made of molybdenum (Mo), ruthenium (Ru), tungsten (W), and/or other conductive materials known to one of ordinary skill in the art. The lower electrode 102 may be used as an input electrode to inject an electrical signal, such as a radio frequency (RF) signal, into the piezoelectric layer 104, and/or as an output electrode to output an electrical signal from the piezoelectric layer 104. For example, if the lower electrode 102 is an input electrode, the upper electrode 105 is an output electrode. If the lower electrode 102 is an output electrode, the upper electrode 105 is an input electrode.

A cavity 103 is formed between the lower electrode 102 and the substrate 101. Therefore, the lower electrode 102 is separated from the substrate 101 by as much as the cavity 103.

The upper electrode 105 is formed on an upper portion of the piezoelectric layer 104. For example, the upper electrode 105 may be formed by vapor depositing Mo, Ru, W, and/or other conductive materials known to one of ordinary skill in the art, on the upper portion of the piezoelectric layer 104. The upper electrode 105 may be used as an input electrode to inject an electrical signal, such as an RF signal, into the piezoelectric layer 104, and/or as an output electrode to output an electrical signal from the piezoelectric layer 104.

The piezoelectric layer 104 is formed on an upper portion of the lower electrode 102, and on the upper portion of the substrate 101. For example, the piezoelectric layer 104 may be formed by vapor depositing an aluminum nitride (AlN), a zinc oxide (ZnO), or a lead zirconate titanate, on the upper portion of the lower electrode 102, and on the upper portion of the substrate 101. The piezoelectric layer 104 converts an electrical signal input from the lower electrode 102 or the upper electrode 105 into an acoustic wave.

In more detail, when a temporally changing electric field is induced, the piezoelectric layer 104 converts the electrical signal into a physical oscillation. The piezoelectric layer 104 converts the physical oscillation into the acoustic wave. The piezoelectric layer 104 generates the acoustic wave to be a bulk acoustic wave based on the induced electric field in a same direction as an oscillation direction in an oriented piezoelectric film.

As shown in FIG. 1, the conductive layers 106 and 107 are formed on a lower portion of the lower electrode 102 and an upper portion of the upper electrode 105, respectively. For example, the conductive layers 106 and 107 may be formed by vapor depositing a conductive material on the lower portion of the lower electrode 102 and the upper portion of the upper electrode 105, respectively. The conductive material may include, for example, silver (Ag), copper (Cu), gold (Au), Al, calcium (Ca), W, zinc (Zn), nickel (Ni), iron (Fe), platinum (Pt), carbon steel, lead, grain-oriented electrical steel, manganin, constantan, stainless steel, and/or graphite.

In more detail, the conductive layers 106 and 107 may be formed by vapor depositing the conductive material adjacent to a resonance unit corresponding to a portion of the upper electrode 105 and/or the lower electrode 102. For example, the conductive layers 106 and 107 may be formed by vapor depositing the conductive material at an interface between the resonance unit and a connection unit corresponding to a remaining portion of the upper electrode 105 and/or the lower electrode 102, such that the conductive material is formed as close as possible to the resonance unit. The vapor depositing of the conductive material at the interface between the resonance unit and the connection unit will be described with reference to FIG. 2.

In another example, the conductive layer 106 may be formed by vapor depositing the conductive material on the upper portion or the lower portion of the lower electrode 102. In more detail, the conductive layer 106 may be formed by vapor depositing the conductive material on the lower portion of the lower electrode 102 that corresponds to the upper portion of the substrate 101, as shown in FIG. 1. Alternatively, the conductive layer 106 may be formed by vapor depositing the conductive material on the upper portion of the lower electrode 102 that corresponds to a lower portion of the piezoelectric layer 104.

In this example, the conductive layer 107 may be formed by vapor depositing the conductive material on the upper portion or a lower portion of the upper electrode 105. In more detail, the conductive layer 107 may be formed by vapor depositing the conductive material on the lower portion of the upper electrode 105 that corresponds to the upper portion of the piezoelectric layer 104.

In still another example, the conductive layer 106 may be formed at the upper electrode 105, whereas the conductive layer 107 is formed at the lower electrode 102.

The conductive layer 106 and the conductive layer 107 may be formed by vapor depositing the conductive material so that the conductive layer 106 and the conductive layer 107 are not shorted with each other. For example, if the conductive layer 106 is formed on the upper portion of the lower electrode 102, and the conductive layer 107 is formed on the lower portion of the upper electrode 105, a short between the conductive layer 106 and the conductive layer 107 may occur. Therefore, if the conductive layer 106 is formed on the upper portion of the lower electrode 102, the conductive layer 107 is formed on the upper portion of the upper electrode 105. If the conductive layer 106 is formed on the lower portion of the lower electrode 102, the conductive layer 107 may be formed on the upper portion or the lower portion of the upper electrode 105. If the conductive layer 107 is formed on the lower portion of the upper electrode 105, the conductive layer 106 is formed on the lower portion of the lower electrode 102. If the conductive layer 107 is formed on the upper portion of the upper electrode 105, the conductive layer 106 may be formed on the upper portion or the lower portion of the lower electrode 102.

Figure 2:
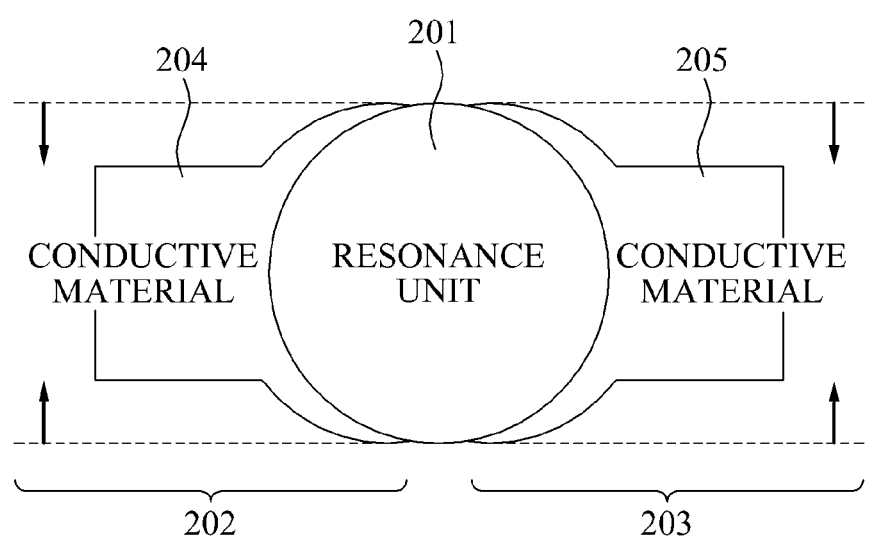
FIG. 2 is a diagram illustrating an example of an operation of vapor depositing a conductive material adjacent to a resonance unit.

FIG. 2 is a diagram illustrating an operation of vapor depositing a conductive material adjacent to a resonance unit 201. Referring to FIG. 2, a resonance apparatus includes the resonance unit 201, connection units 202 and 203, and conductive materials 204 and 205.

The connection units 202 and 203 may connect the resonance apparatus to an external device, using an upper electrode and a lower electrode. For example, the external device may include a transmission device that transmits a signal and a receiving device that receives the signal transmitted from the transmission device. The upper electrode may be included in both the resonance unit 201 and the connection unit 202. The lower electrode may be included in both the resonance unit 201 and the connection unit 203.

In more detail, the resonance apparatus includes a conductive layer formed by vapor depositing a conductive material adjacent to the resonance unit 201. Accordingly, the conductive layer is disposed adjacent to the resonance unit 201. The conductive layer may reduce an electrode resistance generated by the connection units 202 and 203 without affecting an acoustic wave generated by the resonance unit 201.

For example, the resonance apparatus may include a first conductive layer formed by vapor depositing the conductive material 204 as close as possible to the resonance unit 201, namely, the upper electrode of the resonance unit 201. In more detail, the conductive material 204 may be vapor deposited in a region corresponding to an interface between the resonance unit 201 and the connection unit 202, within an entire region of the connection unit 202. That is, the conductive material 204 may not be vapor deposited within a region of the resonance unit 201.

Therefore, the resonance apparatus may reduce a loss of the acoustic wave by vapor depositing Mo, Ru, W, and/or other conductive materials known to one of ordinary skill in the art, on the resonance unit 201, which corresponds to the upper electrode of the resonance unit 201. Also, the resonance apparatus may reduce an electrical loss of the connection unit 202 by vapor depositing the conductive material 204 at the upper electrode.

In another example, the resonance apparatus may include a second conductive layer formed by vapor depositing the conductive material 205 as close as possible to the resonance unit 201, namely, the lower electrode of the resonance unit 201. In more detail, the conductive material 205 may be vapor deposited in a region corresponding to an interface between the resonance unit 201 and the connection unit 203, within an entire region of the connection unit 203. That is, the conductive material 205 may not be vapor deposited within a region of the resonance unit 201.

Therefore, the resonance apparatus may reduce a loss of the acoustic wave by vapor depositing Mo, Ru, W, and/or other conductive materials known to one of ordinary skill in the art, on the resonance unit 201, which corresponds to the lower electrode. Also, the resonance apparatus may reduce an electrical loss of the connection unit 203 by vapor depositing the conductive material 205 at the lower electrode.

In still another example, the resonance apparatus may include the first conductive layer formed by vapor depositing the conductive material 204 as close as possible to the upper electrode of the resonance unit 201, and the second conductive layer formed by vapor depositing the conductive material 205 as close as possible to the lower electrode of the resonance unit 201. Thus, the resonance apparatus may reduce electrical losses of the respective connection units 202 and 203 more than when the resonance apparatus includes only one of the first conductive layer and the second conductive layer.

Figure 3:
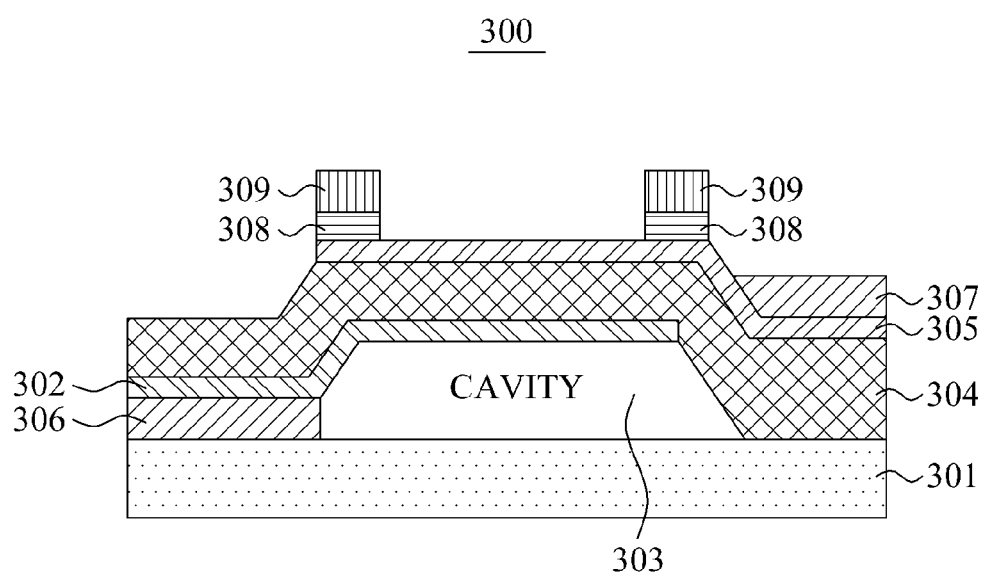
FIG. 3 is a diagram illustrating another example of a resonance apparatus including a loss compensation layer.

FIG. 3 is a diagram illustrating another example of a resonance apparatus 300 including a loss compensation layer 308. Referring to FIG. 3, the resonance apparatus 300 includes a substrate 301, a lower electrode 302, a piezoelectric layer 304, an upper electrode 305, conductive layers 306 and 307, the loss compensation layer 308, and a loss compensation conductive layer 309. A cavity 303 is formed between the lower electrode 302 and the substrate 301.

That is, the resonance apparatus 300 includes the loss compensation layer 308 and the loss compensation conductive layer 309 in addition to the elements of the resonance apparatus 100 of FIG. 1. Therefore, the same elements as in the resonance apparatus 100 of FIG. 1 will not be described again with reference to FIG. 3 for conciseness.

The loss compensation layer 308 is formed on the upper electrode 305. For example, the loss compensation layer 308 may be formed by patterning an upper edge of the upper electrode 305 into a donut shape, or etching a donut-shaped trench in the upper edge of the upper electrode 305. In another example, the loss compensation layer 308 may be formed by vapor depositing a material including Mo, Ru, Au, silicon dioxide (SiO$_2$), and/or silicon nitride (SiN), on an upper portion of the upper electrode 305, and then patterning an upper edge of the material into a donut shape.

In still another example, the loss compensation layer 308 may be formed by doping the upper portion of the upper electrode 305 with a predetermined impurity, and then patterning an upper edge of the upper electrode 305 doped with the predetermined impurity into a donut shape. The predetermined impurity may include, for example, boron (B), phosphorus (P), arsenic (As), germanium (Ge), stibium (Sb), silicon (Si), and/or Al.

The loss compensation layer 308 may prevent an acoustic wave reflected from the upper portion of the upper electrode 305 from being reflected to outside the resonance apparatus 300. Thus, the loss compensation layer 308 may reduce or prevent a loss of the acoustic wave.

The loss compensation conductive layer 309 is formed on the loss compensation layer 308. For example, the loss compensation conductive layer 309 may be formed by vapor depositing a conductive material on the loss compensation layer 308. The conductive material may include, for example, Ag, Cu, Au, Al, Ca, W, Zn, Ni, Fe, Pt, carbon steel, lead, grain-oriented electrical steel, manganin, constantan, stainless steel, and/or graphite. In more detail, the loss compensation conductive layer 309 may be formed by vapor depositing the conductive material on an upper edge of the loss compensation layer 308, and into a laminated structure.

Figure 4:
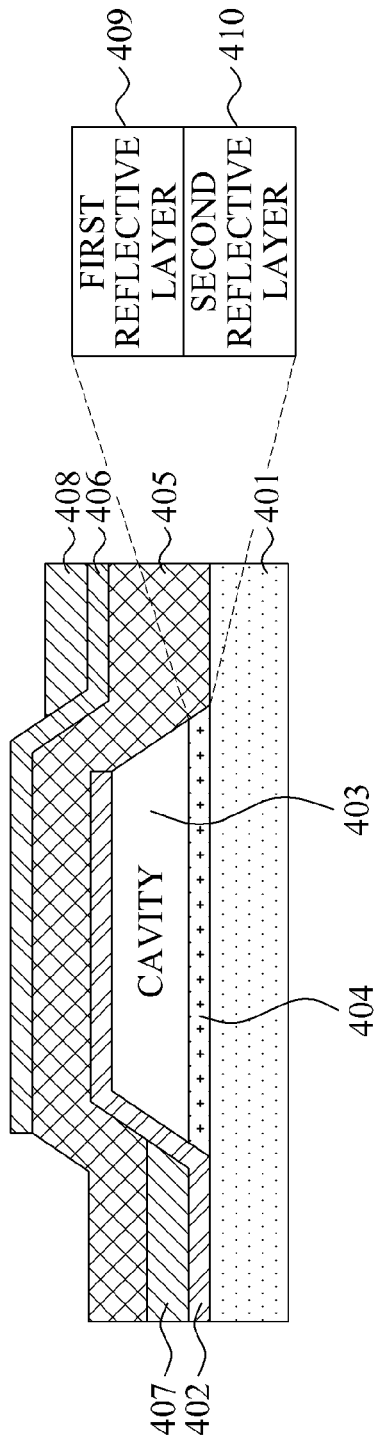
FIG. 4 is a diagram illustrating still another example of a resonance apparatus including a reflective layer.

FIG. 4 is a diagram illustrating still another example of a resonance apparatus 400 including a reflective layer 404. The resonance apparatus 400 includes an air-gap cavity structure and a Bragg reflector structure. The air-gap cavity structure includes a lower electrode, an upper electrode, and a piezoelectric layer, which are arranged on an upper portion of a substrate, with a predetermined cavity arranged between the substrate and the lower electrode. The Bragg reflector structure includes a reflective layer arranged on the upper portion of the substrate that reflects an acoustic wave. According to FIG. 4, the resonance apparatus 400 includes a substrate 401, a lower electrode 402, the reflective layer 404, a piezoelectric layer 405, an upper electrode 406, and conductive layers 407 and 408. A cavity 403 is formed between the lower electrode 402 and the substrate 401 (or the reflective layer 404).

The resonance apparatus 400 includes the reflective layer 404 in addition to the elements of the resonance apparatus 100 of FIG. 1. Therefore, the same elements as in the resonance apparatus 100 of FIG. 1 will not be described again with reference to FIG. 4 for conciseness.

The reflective layer 404 is formed on an upper portion of the substrate 401, and in a partial region of the cavity 403 formed at the upper portion of the substrate 401. As shown in FIG. 4, a side of the reflective layer 404 contacts the lower electrode 402, while another side of the reflective layer 404 contacts the piezoelectric layer 405. The reflective layer 404 reflects the acoustic wave converted in the piezoelectric layer 405.

The reflective layer 404 includes a first reflective layer 409 and a second reflective layer 410. The first reflective layer 409 is formed on an upper portion of the second reflective layer 410. The cavity 403 is formed at an upper portion of the first reflective layer 409. The first reflective layer 409 includes a relatively lower acoustic impedance than the second reflective layer 410. For example, the first reflective layer 409 may be made of a silicon oxide (SiO) based material, a SiN-based material, and/or an aluminum oxide (AlO) based material.

The second reflective layer 410 is formed on the upper portion of the substrate 401, and is disposed under a lower portion of the first reflective layer 409. The second reflective layer 410 includes a relatively higher acoustic impedance than the first reflective layer 409. For example, the second reflective layer 410 may be made of Mo, Ru, W, and/or Pt.

The first reflective layer 409 may include a thickness corresponding to a wavelength of a resonance frequency of the resonance apparatus 400. Also, the second reflective layer 410 may include a thickness corresponding to the wavelength of the resonance frequency of the resonance apparatus 400. For example, each of the first reflective layer 409 and the second reflective layer 410 may include a thickness corresponding to approximately ¼ of the wavelength.

The piezoelectric layer 405 is formed on an upper portion of the lower electrode 402, and on the upper portion of the substrate 401, as described with reference to FIG. 1. In addition, as shown in FIG. 4, the piezoelectric layer 405 is formed on an upper portion of the conductive layer 407.

As shown in FIG. 4, the conductive layer 407 is formed on the upper portion of the lower electrode 402. Alternatively, the conductive layer 407 may be formed on a lower portion of the lower electrode 402, as described with reference to FIG. 1.

Figure 5:
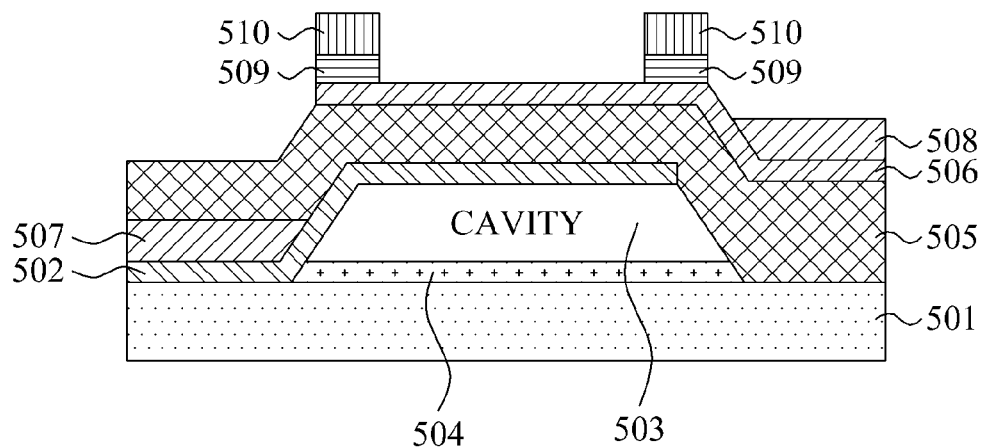
FIG. 5 is a diagram illustrating yet another example of a resonance apparatus including a loss compensation layer and a reflective layer.

FIG. 5 is a diagram illustrating yet another example of a resonance apparatus 500 including a loss compensation layer 509 and a reflective layer 504. According to FIG. 5, the resonance apparatus 500 includes a substrate 501, a lower electrode 502, the reflective layer 504, a piezoelectric layer 505, an upper electrode 506, conductive layers 507 and 508, a loss compensation layer 509, and a loss compensation conductive layer 510. A cavity 503 is formed between the lower electrode 502 and the substrate 501 (or the reflective layer 504).

The resonance apparatus 500 includes the loss compensation layer 509 and the loss compensation conductive layer 510 in addition to the elements of the resonance apparatus 400 of FIG. 4. Therefore, the same elements as in the resonance apparatus 400 of FIG. 4 will not be described again with reference to FIG. 5 for conciseness.

The loss compensation layer 509 is formed on the upper electrode 506. For example, the loss compensation layer 509 may be formed by patterning an upper edge of the upper electrode 506 into a donut shape, or etching a donut-shaped trench in the upper electrode 506. In another example, the loss compensation layer 509 may be formed by vapor depositing a material including Mo, Ru, Au, silicon dioxide (SiO$_2$), and/or silicon nitride (SiN), on an upper portion of the upper electrode 506, and then patterning an upper edge of the material into a donut shape.

In still another example, the loss compensation layer 509 may be formed by doping the upper portion of the upper electrode 506 with a predetermined impurity, and then patterning an upper edge of the upper electrode 506 doped with the predetermined impurity into a donut shape. The predetermined impurity may include, for example, boron (B), phosphorus (P), arsenic (As), germanium (Ge), stibium (Sb), silicon (Si), and/or Al.

The loss compensation layer 509 may prevent an acoustic wave reflected from the upper portion of the upper electrode 506 from being reflected to outside the resonance apparatus 500. Thus, the loss compensation layer 509 may reduce or prevent a loss of the acoustic wave.

The loss compensation conductive layer 510 is formed on the loss compensation layer 509. For example, the loss compensation conductive layer 510 may be formed by vapor depositing a conductive material on the loss compensation layer 509. The conductive material may include, for example, Ag, Cu, Au, Al, Ca, W, Zn, Ni, Fe, Pt, carbon steel, lead, grain-oriented electrical steel, manganin, constantan, stainless steel, and/or graphite. In more detail, the loss compensation conductive layer 510 may be formed by vapor depositing the conductive material on an upper edge of the loss compensation layer 509, and into a laminated structure.

Although the loss compensation layer is illustrated as a donut shape in the examples of FIGS. 3 to 5, the loss compensation layer may include a shape of any of various polygons known to one of ordinary skill in the art.

Figure 6:
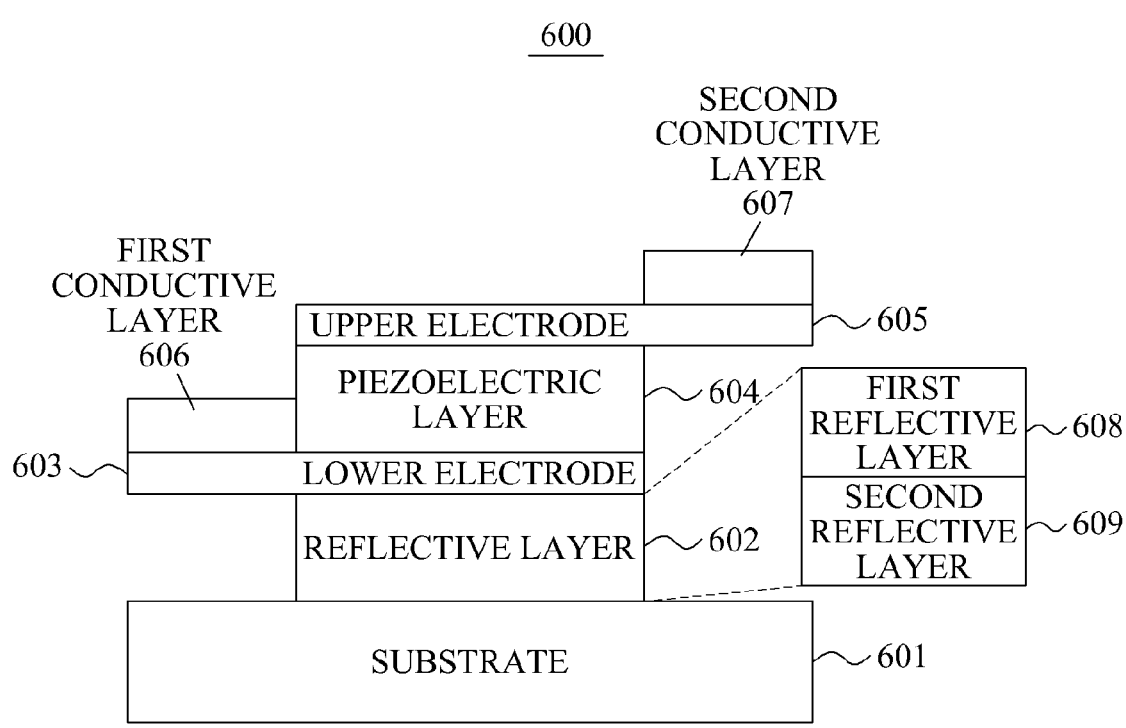
FIG. 6 is a diagram illustrating still another example of a resonance apparatus.

FIG. 6 is a diagram illustrating still another example of a resonance apparatus 600. The resonance apparatus 600 includes a structure and a Bragg reflector structure. The structure includes a lower electrode, an upper electrode, and a piezoelectric layer, which are arranged on an upper portion of a substrate. The Bragg reflector structure includes a reflective layer arranged on the upper portion of the substrate that reflects an acoustic wave. According to FIG. 6, the resonance apparatus 600 includes a substrate 601, a reflective layer 602, a lower electrode 603, a piezoelectric layer 604, an upper electrode 605, and first and second conductive layers 606 and 607.

The reflective layer 602 is formed on an upper portion of the substrate 601, and reflects an acoustic wave toward the piezoelectric layer 604. The reflective layer 602 includes a first reflective layer 608 and a second reflective layer 609.

The first reflective layer 608 is formed on the second reflective layer 609, and is disposed under the lower electrode 603. The second reflective layer 609 is formed on the upper portion of the substrate 601, and is disposed under the first reflective layer 608. The first reflective layer 608 includes a relatively lower acoustic impedance than the second reflective layer 609. The second reflective layer 609 includes a relatively higher acoustic impedance than the first reflective layer 608. Each of the first reflective layer 608 and the second reflective layer 609 may include a thickness corresponding to a wavelength of a resonance frequency of the resonance apparatus 600. For example, the first reflective layer 608 may be made of a SiO-based material, a SiN-based material, an AlO-based material, and/or an AlN-based material, and the second reflective layer 609 may be made of Mo, Ru, W, and/or Pt.

The lower electrode 603 is formed on an upper portion of the reflective layer 602. The lower electrode 603 may be used as an input electrode to inject an electrical signal, such as an RF signal, into the piezoelectric layer 604, and/or as an output electrode to output an electrical signal from the piezoelectric layer 604.

The piezoelectric layer 604 is formed on an upper portion of the lower electrode 603. The piezoelectric layer 604 converts an electrical signal input from the lower electrode 603 or the upper electrode 605 into an acoustic wave.

The upper electrode 605 is formed on an upper portion of the piezoelectric layer 604. The upper electrode 605 may be used as any one of an input electrode to inject an electrical signal, such as an RF signal, into the piezoelectric layer 604, and/or an output electrode to output an electrical signal from the piezoelectric layer 604.

As shown in FIG. 6, the first and second conductive layers 606 and 607 are formed on the upper portion of the lower electrode 603 and an upper portion of the upper electrode 605, respectively. For example, the first and second conductive layers 606 and 607 may be formed by vapor depositing a conductive material on the upper portion of the lower electrode 603 and the upper portion of the upper electrode 605, respectively. The conductive material may include, for example, Ag, Cu, Au, Al, Ca, W, Zn, Ni, Fe, Pt, carbon steel, lead, grain-oriented electrical steel, manganin, constantan, stainless steel, and/or graphite.

In more detail, the first and second conductive layers 606 and 607 may be formed by vapor depositing the conductive material adjacent to a resonance unit corresponding to a portion of the upper electrode 605 and/or the lower electrode 603. For example, the first and second conductive layers 606 and 607 may be formed by vapor depositing the conductive material at an interface between the resonance unit and a connection unit corresponding to a remaining portion of the upper electrode 605 and/or the lower electrode 603, such that the conductive material is disposed as close as possible to the resonance unit. The connection unit may connect the resonance apparatus 600 to an external device, using the upper electrode 605 and the lower electrode 603.

In another example, the first conductive layer 606 may be formed by vapor depositing the conductive material on the upper portion or a lower portion of the lower electrode 603. In more detail, the first conductive layer 606 may be formed by vapor depositing the conductive material on the lower portion of the lower electrode 603 that corresponds to the upper portion of the reflective layer 602. Alternatively, the first conductive layer 606 may be formed by vapor depositing the conductive material on the upper portion of the lower electrode 603 that corresponds to a lower portion of the piezoelectric layer 604, as shown in FIG. 6.

In still another example, the second conductive layer 607 may be formed by vapor depositing the conductive material on any the upper portion or a lower portion of the upper electrode 605. In more detail, the second conductive layer 607 may be formed by vapor depositing the conductive material on the lower portion of the upper electrode 605 that corresponds to the upper portion of the piezoelectric layer 604.

In yet another example, the first conductive layer 606 may be formed at the upper electrode 605, while the second conductive layer 607 may be formed at the lower electrode 603. The first conductive layer 606 and the second conductive layer 607 may be formed by vapor depositing the conductive material so that the first conductive layer 606 and the second conductive layer 607 are not shorted with each other.

Figure 7:
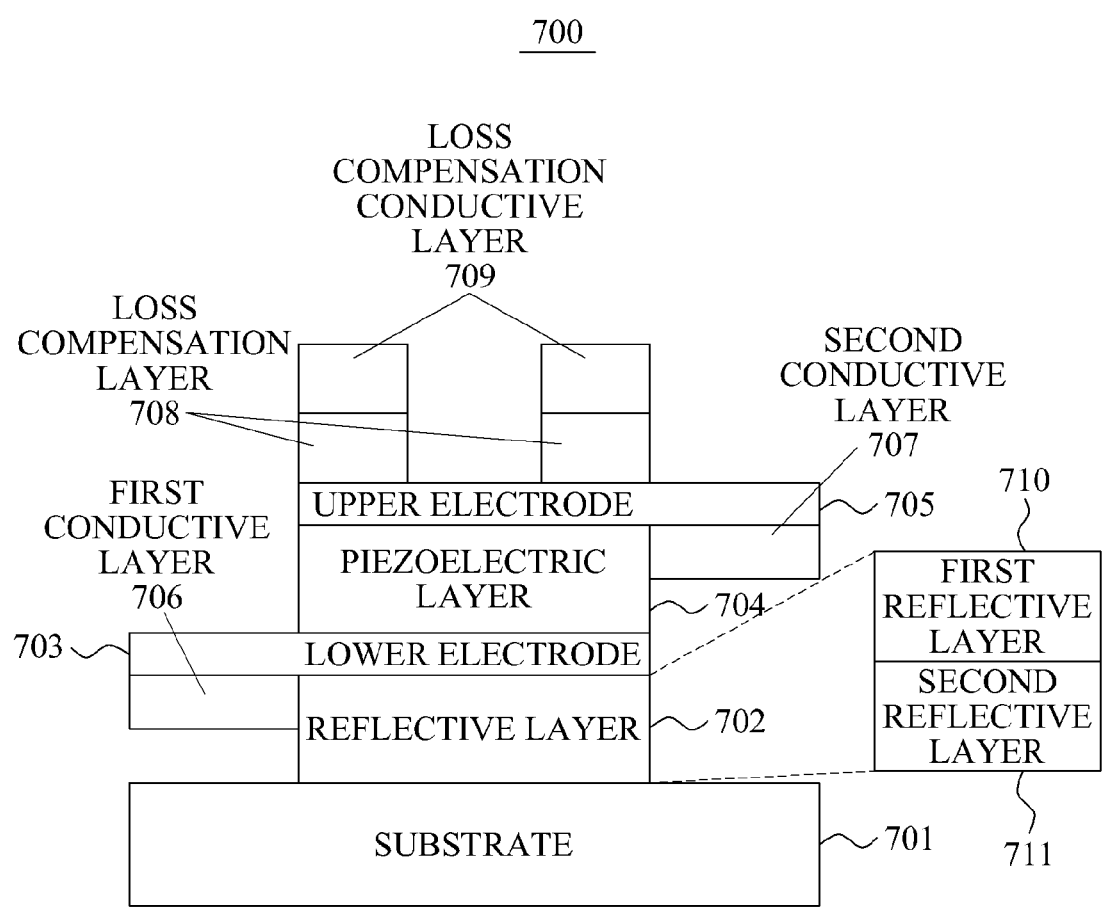
FIG. 7 is a diagram illustrating yet another example of a resonance apparatus including a loss compensation layer.

FIG. 7 is a diagram illustrating yet another example of a resonance apparatus 700 including a loss compensation layer 708. According to FIG. 7, the resonance apparatus 700 includes a substrate 701, a reflective layer 702 including first and second reflective layers 710 and 711, a lower electrode 703, a piezoelectric layer 704, an upper electrode 705, first and second conductive layers 706 and 707, the loss compensation layer 708, and a loss compensation conductive layer 709.

The resonance apparatus 700 includes the loss compensation layer 708 and the loss compensation conductive layer 709 in addition to the elements of the resonance apparatus 600 of FIG. 6. Therefore, the same elements as in the resonance apparatus 600 of FIG. 6 will not be described again with reference to FIG. 7 for conciseness.

As shown in FIG. 7, the first and second conductive layers 706 and 707 are formed on a lower portion of the lower electrode 703 and a lower portion of the upper electrode 705, respectively. Alternatively, the first and second conductive layers 706 and 707 may be formed on an upper portion of the lower electrode 703 and an upper portion of the upper electrode 705, respectively, as shown in FIG. 6.

The loss compensation layer 708 is formed on the upper portion of the upper electrode 705. For example, the loss compensation layer 708 may be formed by patterning an upper edge of the upper electrode 705 into a donut shape, or etching a donut-shaped trench in the upper edge of the upper electrode 705. In another example, the loss compensation layer 708 may be formed by vapor depositing a material including Mo, Ru, Au, $SiO_2$, and/or SiN, on the upper portion of the upper electrode 705, and then patterning an upper edge of the material into a donut shape.

In still another example, the loss compensation layer 708 may be formed by doping the upper portion of the upper electrode 705 with a predetermined impurity, and then patterning an upper edge of the upper electrode 705 doped with the predetermined impurity into a donut shape. The predetermined impurity may include, for example, B, P, As, Ge, Sb, Si, and/or Al.

The loss compensation conductive layer 709 is formed on the loss compensation layer 708. For example, the loss compensation conductive layer 709 may be formed by vapor depositing a conductive material on the loss compensation layer 708. The conductive material may include Ag, Cu, Au, Al, Ca, W, Zn, Ni, Fe, Pt, carbon steel, lead, grain-oriented electrical steel, manganin, constantan, stainless steel, and/or graphite. In more detail, the loss compensation conductive layer 709 may be formed by vapor depositing the conductive material on an upper edge of the loss compensation layer 708, and into a laminated structure.

Figure 8:
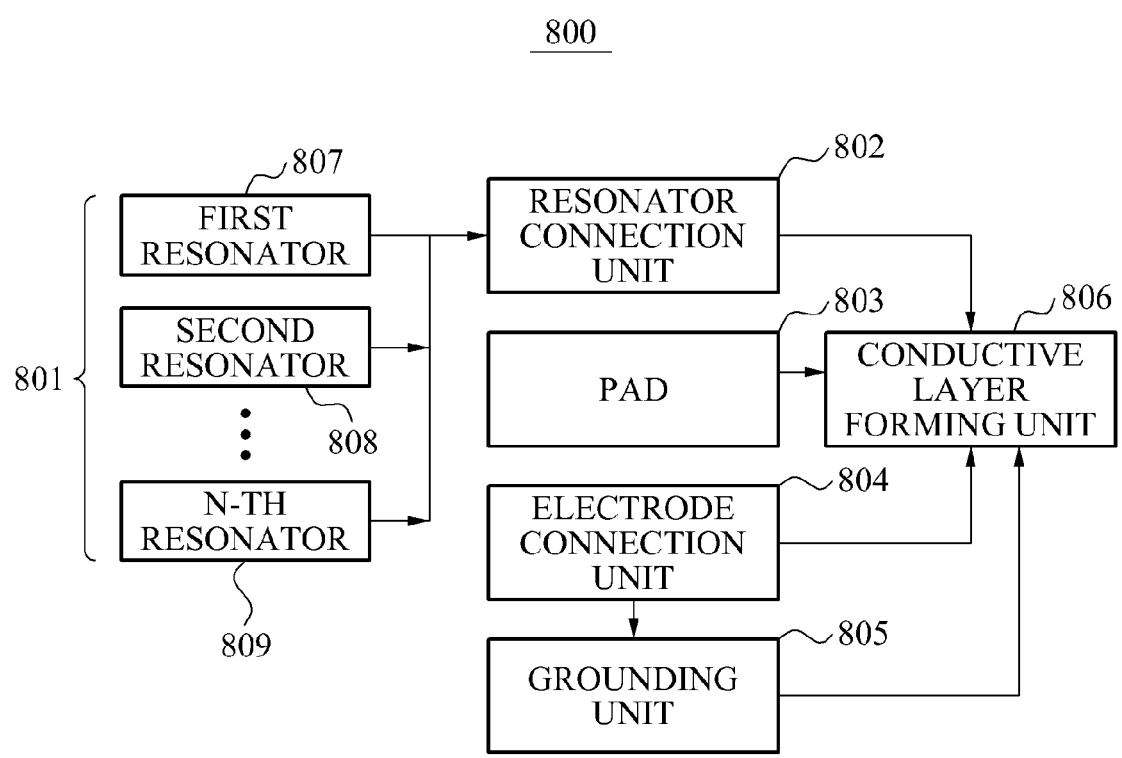
FIG. 8 is a block diagram illustrating an example of a film bulk acoustic filter.

FIG. 8 is a block diagram illustrating an example of a film bulk acoustic filter 800. In FIG. 8, the film bulk acoustic filter 800 may be implemented using the resonance apparatuses (or resonators) as shown in FIGS. 1 to 7. According to FIG. 8, the film bulk acoustic filter 800 includes resonators 801 including a first resonator 807, a second resonator 808, and an n-th resonator 809, a resonator connection unit 802, a pad 803, an electrode connection unit 804, a grounding unit 805, and a conductive layer forming unit 806.

The resonators 801 are formed on an upper portion of a substrate. At least one of the resonators 801 may include a loss compensation layer that may be formed by patterning an edge of an upper electrode into a donut shape. A loss compensation conductive layer may be formed by vapor depositing a conductive material on an upper portion of the loss compensation layer. The conductive material may include, for example, Ag, Cu, Au, Al, Ca, W, Zn, Ni, Fe, Pt, carbon steel, lead, grain-oriented electrical steel, manganin, constantan, stainless steel, and/or graphite.

The resonator connection unit 802 connects the resonators 801 to one another and to the pad 803, the electrode connection unit 804, and/or the grounding unit 805. The pad 803 is formed on the upper portion of the substrate, and provides a connection to an external terminal. In more detail, the pad 803 may connect the external terminal to an upper electrode and/or a lower electrode of at least one of the resonators 801 that are not connected to the grounding unit 805.

The electrode connection unit 804 may connect an upper electrode and a lower electrode of at least one of the resonators 801, to each other. For example, the electrode connection unit 804 may connect an upper electrode of a first resonator 807 to a lower electrode of at least one of a second resonator 808 to an N-th resonator 809. In a similar manner, the electrode connection unit 804 may connect a lower electrode of the first resonator 807 to an upper electrode of at least one of the second resonator 808 to the N-th resonator 809.

The grounding unit 805 may connect an upper electrode and/or a lower electrode of at least one of the resonators 801, to ground. For example, the grounding unit 805 may connect the upper electrode of the first resonator 807 and the lower electrode of the second resonator 808, to ground, whereas the pad 803 may connect a lower electrode of the first resonator 807 and the upper electrode of the second resonator 808, to the external terminal.

The conductive layer forming unit 806 may form a conductive layer adjacent to at least one of the resonators 801 and on the resonator connection unit 802, the pad 803, the electrode connection unit 804, and/or the grounding unit 805, to reduce an electrical loss of these elements. The conductive layer may be made of a conductive material including, for example, Ag, Cu, Au, Al, Ca, W, Zn, Ni, Fe, Pt, carbon steel, lead, grain-oriented electrical steel, manganin, constantan, stainless steel, and/or graphite. Accordingly, the film bulk acoustic filter 800 may reduce or remove a loss of a quality factor (Q factor) and an insertion loss of at least one of the resonators 801.

Figure 9:
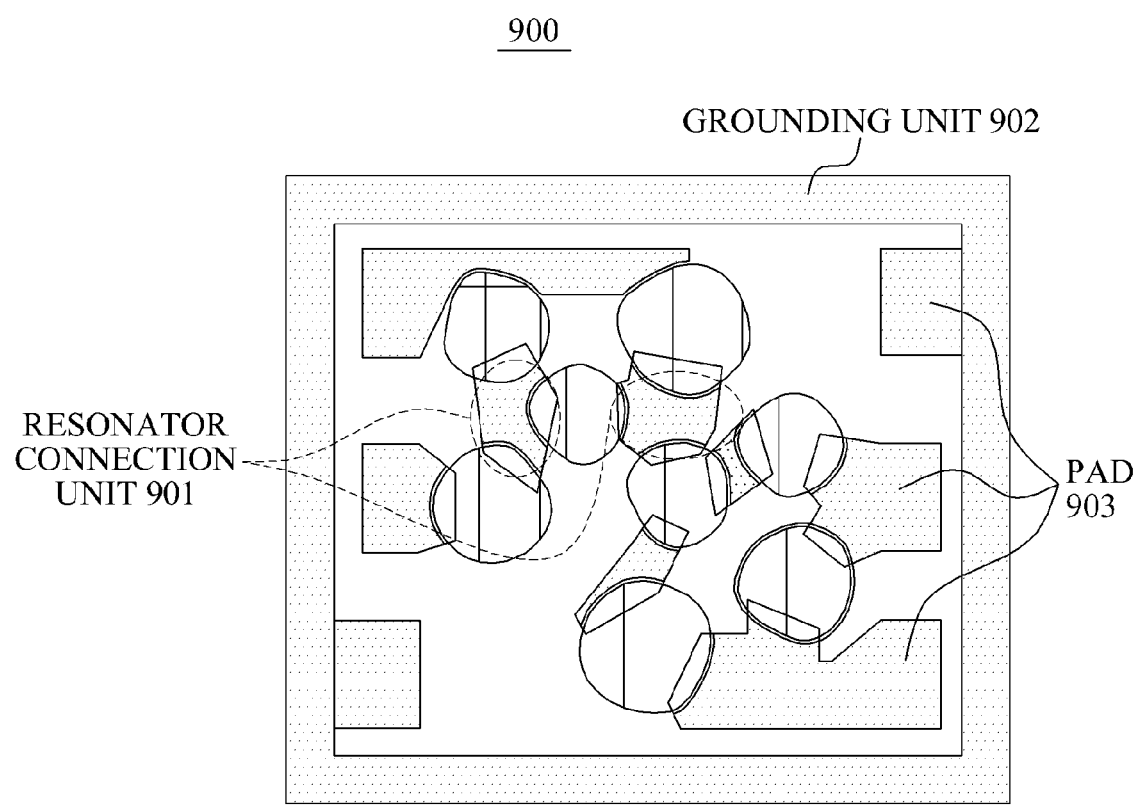
FIG. 9 is a diagram illustrating another example of a film bulk acoustic filter.

FIG. 9 is a diagram illustrating another example of a film bulk acoustic filter 900. In FIG. 9, the film bulk acoustic filter 900 includes resonators, a resonator connection unit 901, a grounding unit 902, and a pad 903.

The resonator connection unit 901 connects the resonators to one another and to the grounding unit 902 and/or the pad 903. The resonator connection unit 901 may be made of a conductive material.

The grounding unit 902 may be formed by vapor depositing a conductive material on an edge of a substrate. The grounding unit 902 may connect an upper electrode and/or a lower electrode of at least one of the resonators, to ground.

The pad 903 may be single or plural in number, and may be formed by vapor depositing a conductive material on a partial region of the substrate. The pad 903 may connect an external terminal to an upper electrode and/or a lower electrode of at least one of the resonators that are not connected to the grounding unit 902.

Figure 10:
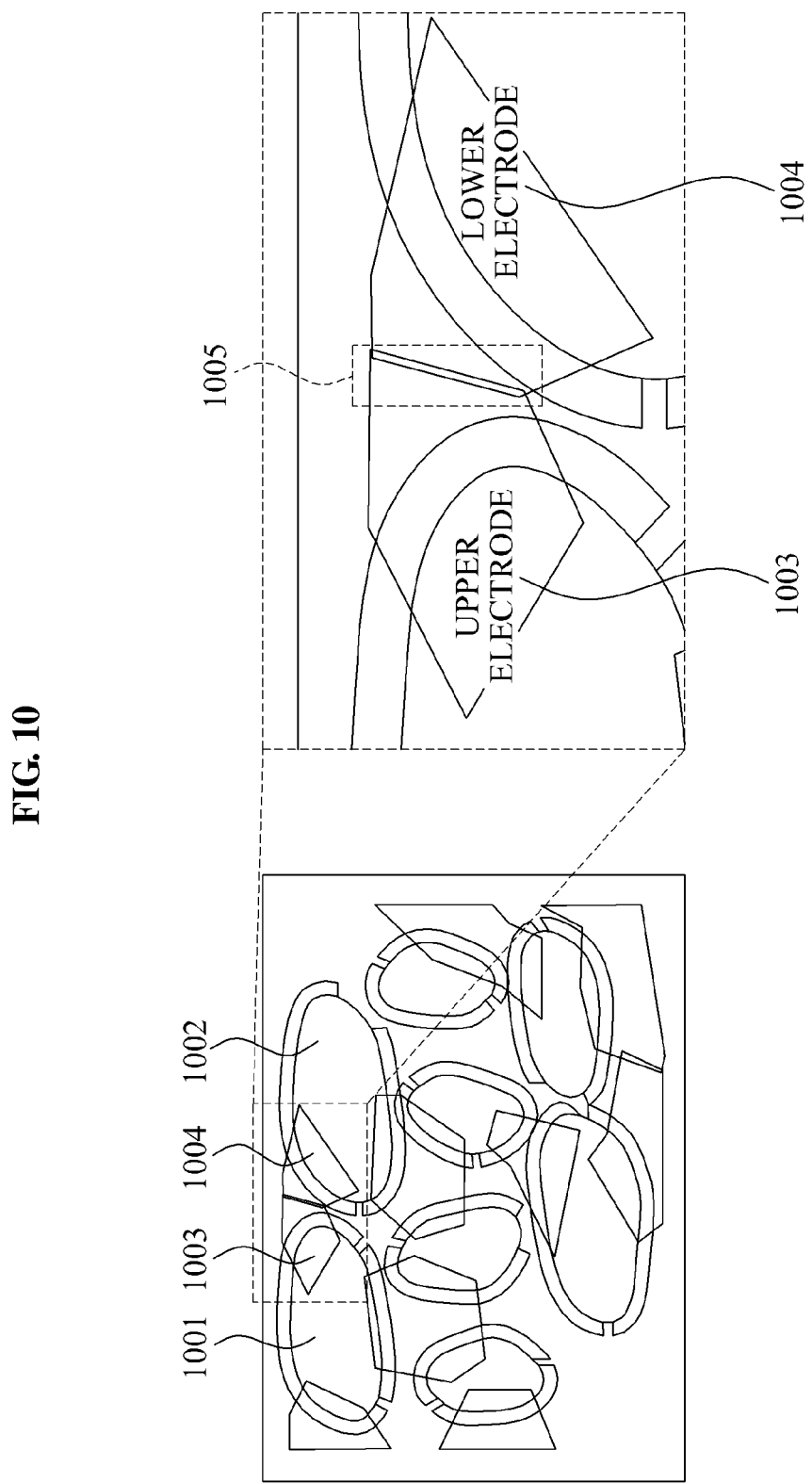
FIG. 10 is a diagram illustrating an example of an electrode connection unit in a film bulk acoustic filter.

FIG. 10 is a diagram illustrating an example of an electrode connection unit in a film bulk acoustic filter. According to FIG. 10, the electrode connection unit connects an upper electrode and a lower electrode of at least one of resonators of the film bulk acoustic filter, to each other.

For example, the electrode connection unit connects an upper electrode 1003 of a first resonator 1001 to a lower electrode 1004 of a second resonator 1002, using a conductive material 1005. That is, the electrode connection unit connects an upper electrode and a lower electrode of different resonators, to each other. Thus, the electrode connection unit may reduce an electrical resistance generated during a connection.

In this example, the conductive material may include a high conductivity material including a conductivity of about $1 \times 10^5$ σS/m or higher. For example, the conductive material may include Ag, Cu, Au, Al, Ca, W, Zn, Ni, Fe, Pt, carbon steel, lead, grain-oriented electrical steel, manganin, constantan, stainless steel, and/or graphite.

Figure 11:
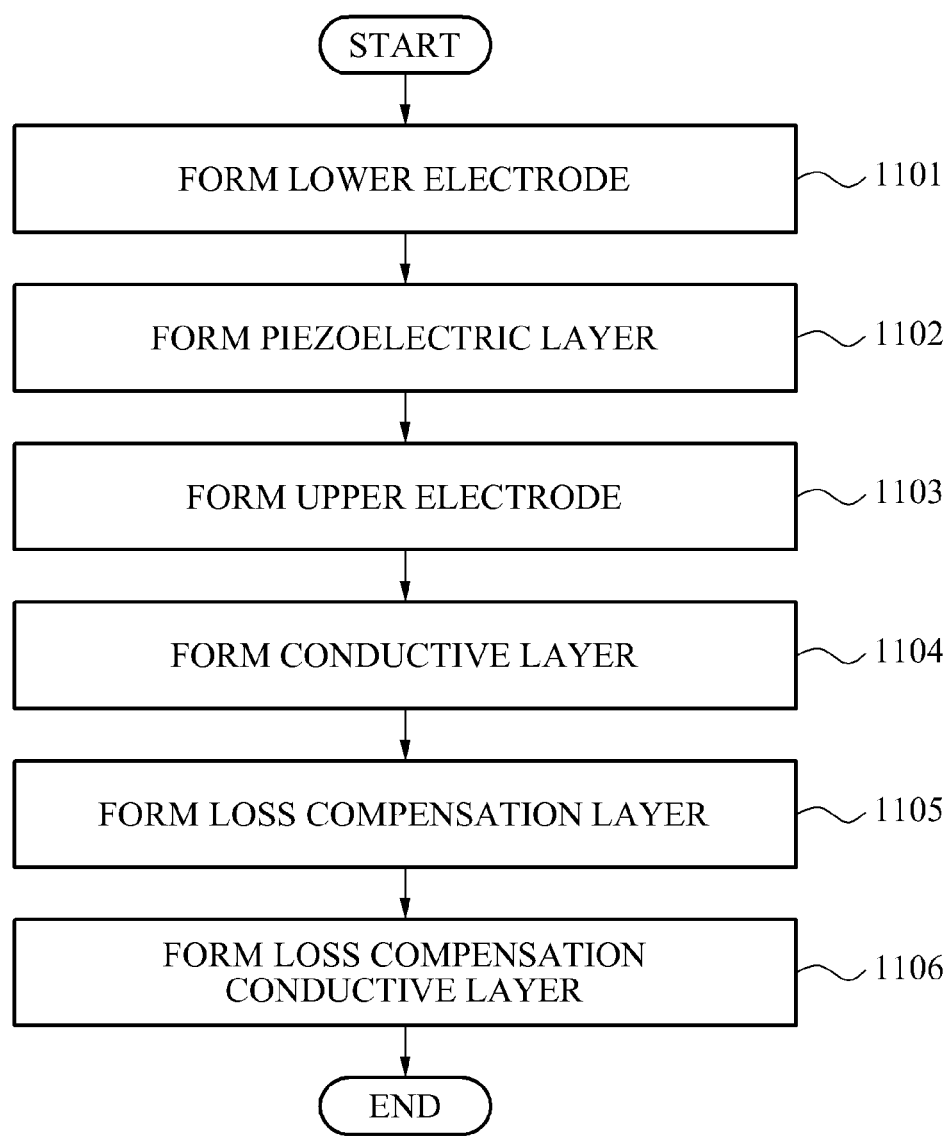
FIG. 11 is a flowchart illustrating an example of a method of manufacturing a resonance apparatus.

FIG. 11 is a flowchart illustrating an example of a method of manufacturing a resonance apparatus. The resonance apparatus includes an air-gap cavity structure.

Referring to FIG. 11, in operation 1101, a lower electrode is formed to be separated by a predetermined distance from an upper portion of a substrate. For example, the lower electrode may be made of Mo, Ru, W, and/or other conductive materials known to one of ordinary skill in the art. The lower electrode may be used as an input electrode to inject an electrical signal, such as an RF signal, into a piezoelectric layer, and/or as an output electrode to output an electrical signal from the piezoelectric layer. Accordingly, a cavity is formed between the lower electrode and the substrate. Therefore, the lower electrode is separated from the substrate by as much as the cavity. The substrate may be doped with Si. For example, the substrate may include a Si wafer.

In operation 1102, a piezoelectric layer is formed on an upper portion of the lower electrode. For example, the piezoelectric layer may be formed by vapor depositing AlN, ZnO, or lead zirconate titanate on the upper portion of the lower electrode. The piezoelectric layer converts an electrical signal input from the lower electrode or an upper electrode into an acoustic wave.

In more detail, when a temporally changing electric field is induced, the piezoelectric layer converts the electrical signal into a physical oscillation. In addition, the piezoelectric layer converts the physical oscillation into the acoustic wave. The piezoelectric layer generates the acoustic wave to be a bulk acoustic wave based on the induced electric field in a same direction as an oscillation direction in an oriented piezoelectric film.

In operation 1103, the upper electrode is formed on an upper portion of the piezoelectric layer. For example, the upper electrode may be formed by vapor depositing Mo, Ru, W, and/or other conductive materials known to one of ordinary skill in the art, on the upper portion of the piezoelectric layer. The upper electrode may be used as an input electrode to inject an electrical signal, such as an RF signal, into the piezoelectric layer, and/or as an output electrode to output an electrical signal from the piezoelectric layer.

In operation 1104, a conductive layer is formed on the upper electrode and/or the lower electrode. For example, the conductive layer may be formed by vapor depositing a conductive material on the upper electrode and/or the lower electrode. The conductive material may include, for example, a high conductivity material including a conductivity of about $1 \times 10^5$ σS/m or higher. For example, the conductive material may include Ag, Cu, Au, Al, Ca, W, Zn, Ni, Fe, Pt, carbon steel, lead, grain-oriented electrical steel, manganin, constantan, stainless steel, and/or graphite.

For example, a first conductive layer may be formed by vapor depositing the conductive material on a lower portion of the lower electrode that corresponds to the upper portion of the substrate. Alternatively, the first conductive layer may be formed by vapor depositing the conductive material on the upper portion of the lower electrode that corresponds to a lower portion of the piezoelectric layer.

In this example, a second conductive layer may be formed by vapor depositing the conductive material on an upper portion or a lower portion of the upper electrode. In more detail, the second conductive layer may be formed by vapor depositing vapor the conductive material on the lower portion of the upper electrode that corresponds to the upper portion of the piezoelectric layer.

In another example, the first conductive layer may be formed at the upper electrode, and the second conductive layer may be formed at the lower electrode. In still another example, the first conductive layer and the second conductive layer may be formed by vapor depositing the conductive material so the first conductive layer and the second conductive layer are not shorted with each other. For example, the first conductive layer may be formed on the upper portion of the lower electrode, while the second conductive layer may be formed on the upper portion of the upper electrode. Alternatively, the first conductive layer may be formed on the lower portion of the lower electrode, while the second conductive layer may be formed on the upper portion or the lower portion of the upper electrode.

In operation 1105, a loss compensation layer is formed on the upper electrode. For example, the loss compensation layer may be formed by patterning an upper edge of the upper electrode into a donut shape, or etching a donut-shaped trench in the upper edge of the upper electrode. In another example, the loss compensation layer may be formed by vapor depositing a material including Mo, Ru, Au, $SiO_2$, and/or SiN, on the upper portion of the upper electrode, and then patterning an upper edge of the material into a donut shape.

In still another example, the loss compensation layer may be formed by doping the upper portion of the upper electrode with a predetermined impurity, and then patterning an upper edge of the upper electrode doped with the predetermined impurity into a donut shape. The predetermined impurity may include, for example, B, P, As, Ge, Sb, Si, and/or Al.

Thus, the loss compensation layer may prevent an acoustic wave reflected from the upper portion of the upper electrode from being reflected to outside of the resonance apparatus. Therefore, the loss compensation layer may reduce or prevent a loss of the acoustic wave.

In operation 1106, a loss compensation conductive layer is formed on the loss compensation layer. For example, the loss compensation conductive layer may be formed by vapor depositing a conductive material on the loss compensation layer. The conductive material may include, for example, Ag, Cu, Au, Al, Ca, W, Zn, Ni, Fe, Pt, carbon steel, lead, grain-oriented electrical steel, manganin, constantan, stainless steel, and/or graphite. In more detail, the loss compensation conductive layer may be formed by vapor depositing the conductive material on an upper edge of the loss compensation layer, and into a laminated structure.

Figure 12:
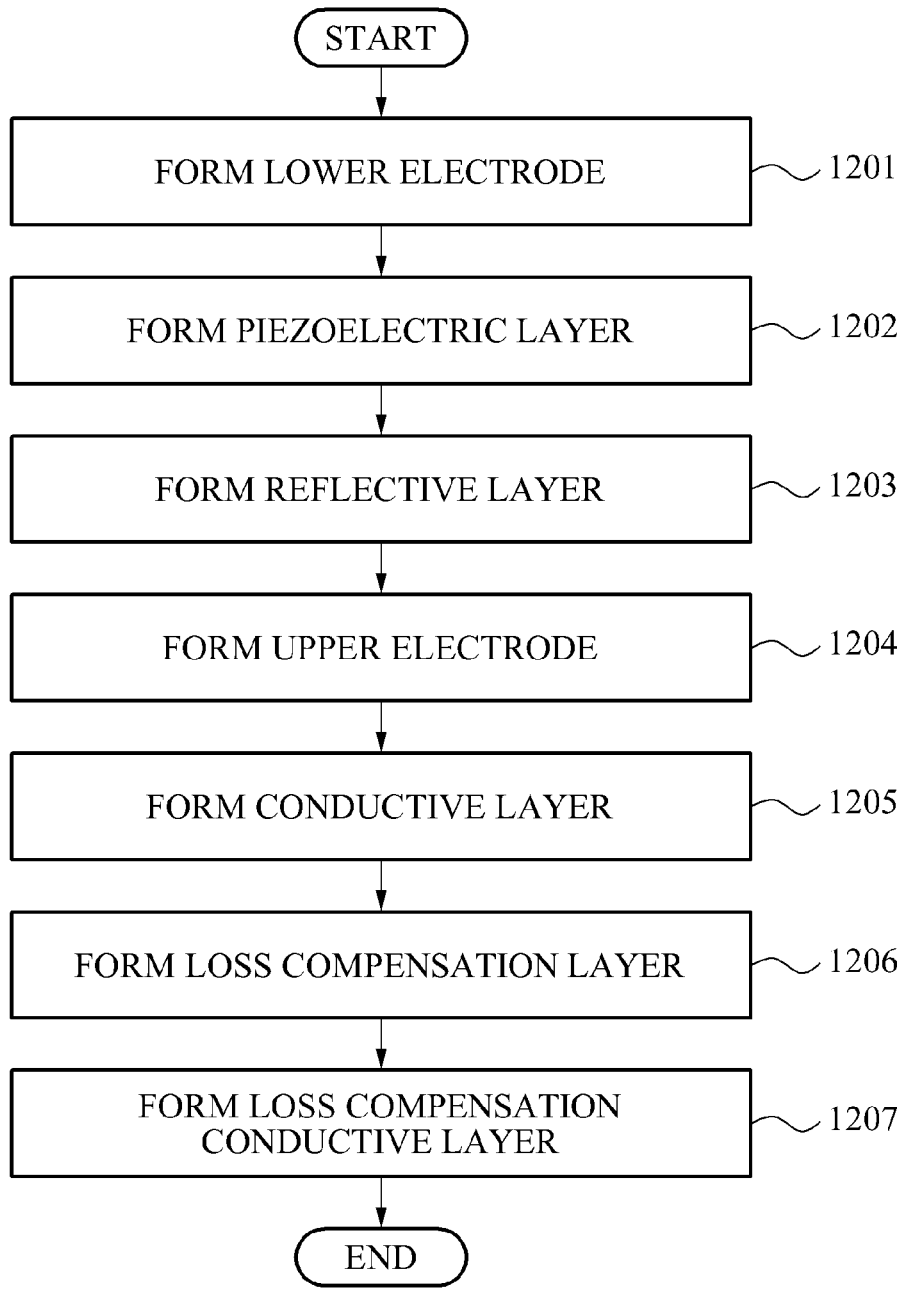
FIG. 12 is a flowchart illustrating another example of a method of manufacturing a resonance apparatus.

FIG. 12 is a flowchart illustrating another example of a method of manufacturing a resonance apparatus. The resonance apparatus includes an air-gap cavity structure and a Bragg reflector structure.

That is, the method of manufacturing the resonance apparatus includes forming the Bragg reflector structure in addition to the operations of the method of manufacturing the resonance apparatus of FIG. 11. Therefore, the same operations as in the method of manufacturing the resonance apparatus of FIG. 11 will not be described in detail with reference to FIG. 12 for conciseness.

Referring to FIG. 12, in operation 1201, a lower electrode is formed at a predetermined distance from an upper portion of a substrate.

In operation 1202, a piezoelectric layer is formed on an upper portion of the lower electrode.

In operation 1023, a reflective layer is formed on the upper portion of the substrate. The reflective layer reflects an acoustic wave converted by the piezoelectric layer. The reflective layer may include a thickness corresponding to a wavelength of a resonance frequency of the resonance apparatus. The reflective layer may include a first reflective layer and a second reflective layer. For example, the second reflective layer may be formed by vapor depositing Mo, Ru, W, and/or Pt, on the upper portion of the substrate. In addition, the first reflective layer may be formed by vapor depositing a SiO-based material, a SiN-based material, an AlO-based material, and/or an AlN-based material, on an upper portion of the second reflective layer. A cavity is formed at an upper portion of the first reflective layer. Accordingly, the first reflective layer may include a relatively lower acoustic impedance than the second reflective layer.

In operation 1204, the upper electrode is formed on an upper portion of the piezoelectric layer.

In operation 1205, a conductive layer is formed on the upper electrode and/or the lower electrode.

In operation 1206, a loss compensation layer is formed on the upper electrode.

In operation 1207, a loss compensation conductive layer is formed on the loss compensation layer.

Figure 13:
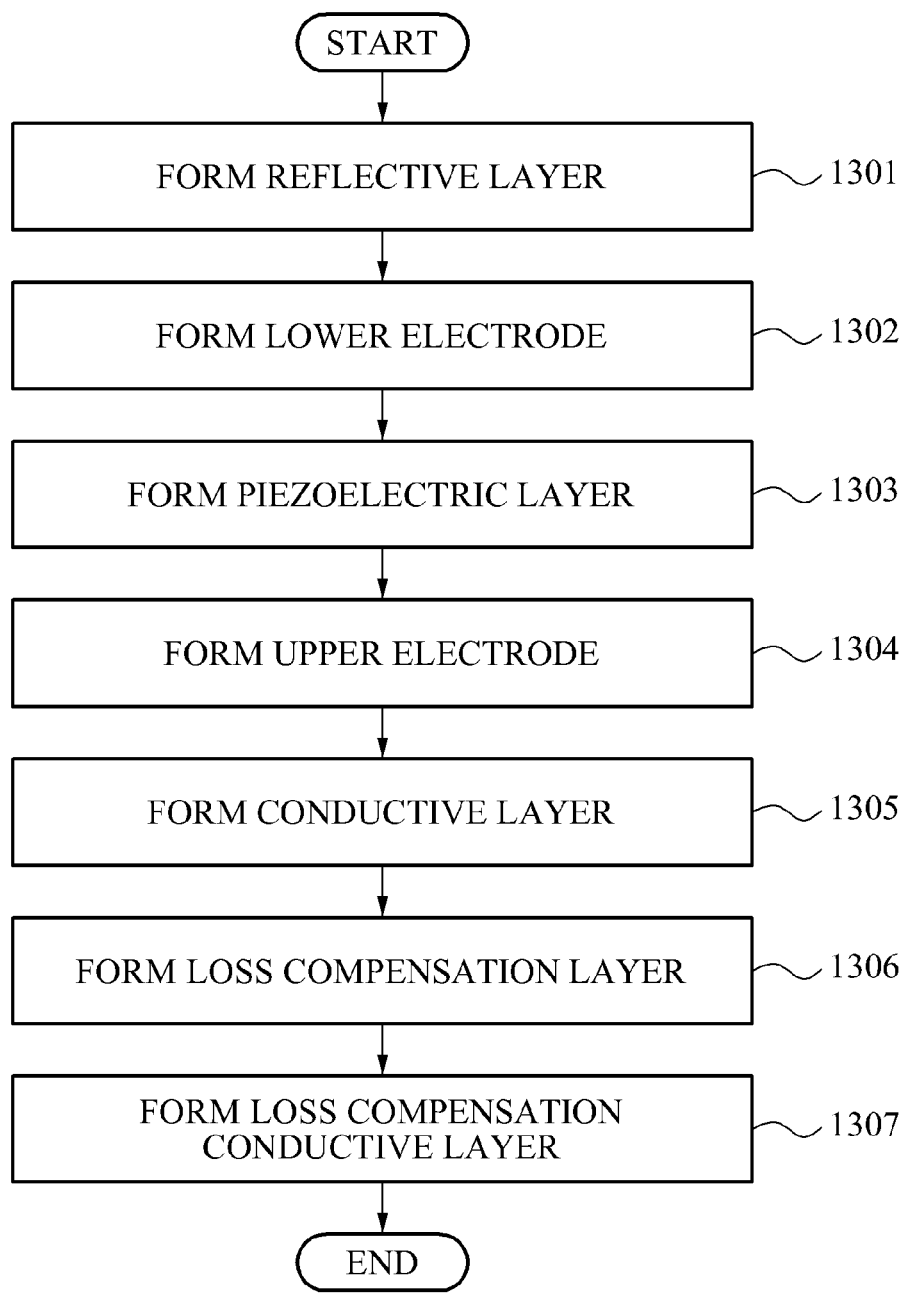
FIG. 13 is a flowchart illustrating still another example of a method of manufacturing a resonance apparatus.

FIG. 13 is a flowchart illustrating still another method of manufacturing a resonance apparatus. The resonance apparatus includes a structure and a Bragg reflector structure.

That is, the method of manufacturing the resonance apparatus includes forming the Bragg reflector structure in addition to the operations of the method of manufacturing the resonance apparatus of FIG. 11. Therefore, the same operations as in the method of manufacturing the resonance apparatus of FIG. 11 will not be described in detail with reference to FIG. 13 for conciseness.

Referring to FIG. 13, in operation 1301, a reflective layer is formed on an upper portion of a substrate. The reflective layer reflects an acoustic wave converted by a piezoelectric layer. The reflective layer may include a thickness corresponding to a wavelength of a resonance frequency of the resonance apparatus. The reflective layer may include a first reflective layer and a second reflective layer. For example, the second reflective layer may be formed by vapor depositing Mo, Ru, W, and/or Pt, on the upper portion of the substrate. In addition, the first reflective layer may be formed by vapor depositing a SiO-based material, a SiN-based material, an AlO-based material, and an AlN-based material, on an upper portion of the second reflective layer. Accordingly, the first reflective layer may include a relatively lower acoustic impedance than the second reflective layer.

In operation 1302, a lower electrode is formed on an upper portion of the reflective layer.

In operation 1303, a piezoelectric layer is formed on an upper portion of the lower electrode.

In operation 1304, an upper electrode is formed on an upper portion of the piezoelectric layer.

In operation 1305, a conductive layer is formed on the upper electrode and/or the lower electrode.

In operation 1306, a loss compensation layer is formed on the upper electrode.

In operation 1307, a loss compensation conductive layer is formed on the loss compensation layer.

The units described herein may be implemented using hardware components and software components. For example, the hardware components may include microphones, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, that independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more computer readable recording mediums. The computer readable recording medium may include any data storage device that can store data which can be thereafter read by a computer system or processing device. Examples of the non-transitory computer readable recording medium include read-only memory (ROM), random-access memory (RAM), CD-ROMs, magnetic tapes, floppy disks, and optical data storage devices. Also, functional programs, codes, and code segments that accomplish the examples disclosed herein can be easily construed by programmers skilled in the art to which the examples pertain based on and using the flow diagrams and block diagrams of the figures and their corresponding descriptions as provided herein.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents.

What is claimed is:

1. A resonance apparatus, comprising:
a lower electrode;
a piezoelectric layer formed on the lower electrode; and
an upper electrode formed on the piezoelectric layer; and
a conductive layer portion formed on at least one of the upper electrode and the lower electrode to be adjacent to a resonance unit, which includes at least portions of the lower electrode, the piezoelectric layer, and the upper electrode, that is configured to physically oscillate
wherein the conductive layer portion includes a first portion and a second portion, the first portion extending from the second portion and partially surrounding the resonance unit and configured to create a low resistance external connection with one of the upper electrode and the lower electrode.

2. The resonance apparatus of claim 1 further comprising:
a loss compensation layer formed on the upper electrode outside of, or at an outer periphery portion of, the resonance unit for preventing loss of acoustic waves from the resonance unit,
wherein the conductive layer portion is arranged outside of the loss compensation layer with respect to the outer periphery of the resonance unit.

3. The resonance apparatus of claim 2, further comprising:
a loss compensation conductive layer formed on the loss compensation layer for further preventing loss of acoustic waves from the resonance unit, the loss compensation conductive layer being including a different material than the loss compensation layer.

4. The resonance apparatus of claim 3, wherein the loss compensation conductive layer comprises silver (Ag), or copper (Cu), or gold (Au), or aluminum (Al), or calcium (Ca), or tungsten (W), or zinc (Zn), or nickel (Ni), or iron (Fe), or platinum (Pt), or carbon steel, or lead, or grain-oriented electrical steel, or manganese, or constantan, or stainless steel, or graphite, or any combination thereof.

5. The resonance apparatus of claim 2, wherein the loss compensation layer comprises molybdenum (Mo), or ruthenium (Ru), or gold (Au), or silicon dioxide ($SiO_2$), or silicon nitride (SiN), or any combination thereof.

6. A resonance apparatus comprising:
a lower electrode;
a piezoelectric layer formed on the lower electrode;
an upper electrode formed on the piezoelectric layer;
a conductive layer portion formed on at least one of the upper electrode and the lower electrode to be adjacent to a resonance unit, which includes at least portions of the lower electrode, the piezoelectric layer, and the upper electrode, that is configured to physically oscillate; and
a reflective layer formed on a substrate,
wherein the conductive layer portion includes a first portion and a second portion, the first portion extending from the second portion and partially surrounding the resonance unit for the adjacency with the resonance unit, and configured to create a low resistance external connection with one of the upper electrode and the lower electrode.

7. The resonance apparatus of claim 6, wherein the reflective layer comprises:
a first reflective layer; and
a second reflective layer formed on the substrate, the first reflective layer being formed on the second reflective layer and comprising a relatively lower acoustic impedance than the second reflective layer.

8. The resonance apparatus of claim 7, wherein:
the first reflective layer comprises a silicon oxide (SiO) based material, a silicon nitride (SiN) based material, or an aluminum oxide (A10) based material, or any combination thereof; and
the second reflective layer comprises molybdenum (Mo), or ruthenium (Ru), or tungsten (W), or platinum (Pt), or any combination thereof.

9. The resonance apparatus of claim 7, wherein each of the first reflective layer and the second reflective layer comprises a thickness corresponding to a wavelength of a resonance frequency of the resonance apparatus.

10. The resonance apparatus of claim 6, wherein the lower electrode is formed on the reflective layer.

11. The resonance apparatus of claim 1, wherein the conductive layer portion comprises silver (Ag), or copper (Cu), or gold (Au), or aluminum (Al), or calcium (Ca), or tungsten (W), or zinc (Zn), or nickel (Ni), or iron (Fe), or platinum (Pt), or carbon steel, or lead, or grain-oriented electrical steel, or manganese, or stainless steel, or graphite, or any combination thereof.

12. The resonance apparatus of claim 1, wherein the conductive layer portion is formed one of the upper electrode and the lower electrode as a first conductive layer portion and the resonance apparatus further includes a second conductive layer portion formed on another one of the upper electrode and the lower electrode.

13. The resonance apparatus of claim 12,
wherein the first conductive layer portion does not contact a portion of the upper electrode corresponding to the resonance unit; and
wherein the second conductive layer portion does not contact a portion of the lower electrode corresponding to the resonance unit.

14. The resonance apparatus of claim 1, further comprising:
a loss compensation layer formed on the upper electrode outside of, or at an outer periphery portion of, the resonance unit for preventing loss of acoustic waves from the resonance unit; and
a reflective layer formed on a substrate,
wherein the conductive layer portion is arranged outside of the loss compensation layer with respect to the outer periphery of the resonance unit.

15. The resonance apparatus of claim 14, further comprising:
a loss compensation conductive layer formed on the loss compensation layer for further preventing loss of acoustic waves from the resonance unit, the loss compensation conductive layer being including a different material than the loss compensation layer.

16. The resonance apparatus of claim 15, wherein the reflective layer comprises:
a first reflective layer; and
a second reflective layer formed on the substrate, the first reflective layer being formed on the second reflective layer and comprising a relatively lower acoustic impedance than the second reflective layer.

17. The resonance apparatus of claim 16, wherein each of the first reflective layer and the second reflective layer comprises a thickness corresponding to a wavelength of a resonance frequency of the resonance apparatus.

18. The resonance apparatus of claim 17, wherein the lower electrode is formed on the reflective layer.

19. The resonance apparatus of claim 1, wherein
the conductive layer portion does not contact a portion of the upper electrode corresponding to the resonance unit and does not contact a portion of the lower electrode corresponding to the resonance unit.

20. A resonance apparatus, comprising:
a resonance unit configured to physically oscillate, the resonance unit including:
a lower electrode;
a piezoelectric layer formed on the lower electrode; and
an upper electrode formed on the piezoelectric layer;
a loss compensation layer formed on the upper electrode outside of, or at an outer periphery portion of, the resonance unit for preventing loss of acoustic waves from the resonance unit; and
a conductive layer formed on at least one of the upper electrode and the lower electrode,
wherein the conductive layer is formed adjacent to, and to partially surround, the resonance unit and outside of the loss compensation layer with respect to the outer periphery of the resonance unit.

21. The resonance apparatus of claim 1, wherein the first portion of the conductive layer portion increases in width in a direction toward the resonance unit for the adjacency with, and partially surrounding of, the resonance unit.

22. The resonance apparatus of claim 1, wherein the conductive layer portion is configured with respect to the resonance unit to not affect acoustic waves generated by the resonance unit.

23. The resonance apparatus of claim 1, wherein the first portion is curved along the surrounding of the resonance unit.

24. The resonance apparatus of claim 6, wherein the first portion of the conductive layer portion increases in width in a direction toward the resonance unit for the adjacency with, and partially surrounding of, the resonance unit.

25. The resonance apparatus of claim 6, wherein the conductive layer portion is configured with respect to the resonance unit to not affect acoustic waves generated by the resonance unit.

26. The resonance apparatus of claim 6, wherein the first portion is curved along the surrounding of the resonance unit.

27. A resonance apparatus, the apparatus comprising:
a first resonant unit configured to physically oscillate, the first resonance unit including:
a lower electrode;
a piezoelectric layer formed on the lower electrode; and
a upper electrode formed on the piezoelectric layer;
a conductive layer portion being adjacent to, and respectively partially surrounding, the first resonance unit; and
a loss compensation layer formed on the upper electrode outside of, or at an outer periphery portion of, the resonance unit for preventing loss of acoustic waves from the first resonance unit,
wherein the conductive layer portion is configured to create a low-resistance connection between one of the upper electrode and the lower electrode of the first resonant unit and one electrode of a second resonant unit that is configured to physically resonate, and the conductive layer portion is arranged outside of the loss compensation layer with respect to the outer periphery of the resonance unit.

28. The resonance apparatus of claim 20, further comprising:
a loss compensation conductive layer formed on the loss compensation layer for further preventing of loss of acoustic waves from the resonance unit, the loss compensation conductive layer being including a different material than the loss compensation layer.

29. The resonance apparatus of claim 28, wherein the loss compensation conductive layer comprises silver (Ag), or copper (Cu), or gold (Au), or aluminum (Al), or calcium (Ca), or tungsten (W), or zinc (Zn), or nickel (Ni), or iron (Fe), or platinum (Pt), or carbon steel, or lead, or grain-oriented electrical steel, or manganese, or constantan, or stainless steel, or graphite, or any combination thereof.

30. The resonance apparatus of claim 20, wherein the loss compensation layer comprises molybdenum (Mo), or ruthenium (Ru), or gold (Au), or silicon dioxide ($SiO_2$), or silicon nitride (SiN), or any combination thereof.

31. The resonance apparatus of claim 20, wherein the resonance unit further comprises a reflective layer formed on a substrate, including a first reflective layer and a second reflective layer formed on the substrate, the first reflective layer being formed on the second reflective layer and comprising a relatively lower acoustic impedance than the second reflective layer.

32. The resonance apparatus of claim 20, wherein the resonance apparatus is a film bulk acoustic wave resonator, with the resonance apparatus further comprising a cavity below the resonance unit.

33. The resonance apparatus of claim 20, wherein the conductive layer is configured with respect to the resonance unit to not affect acoustic waves generated by the resonance unit.

* * * * *